(12) United States Patent
Choi et al.

(10) Patent No.: US 12,035,590 B2
(45) Date of Patent: Jul. 9, 2024

(54) LIGHT EMITTING DISPLAY PANEL AND LIGHT EMITTING DISPLAY APPARATUS USING THE SAME

(71) Applicant: LG Display Co., Ltd., Seoul (KR)

(72) Inventors: Howon Choi, Paju-si (KR); Dohong Kim, Paju-si (KR); Chanil Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 499 days.

(21) Appl. No.: 17/510,984

(22) Filed: Oct. 26, 2021

(65) Prior Publication Data

US 2022/0130940 A1 Apr. 28, 2022

(30) Foreign Application Priority Data

Oct. 28, 2020 (KR) ........................ 10-2020-0141302

(51) Int. Cl.
*H10K 59/131* (2023.01)
*H10K 50/844* (2023.01)
*H10K 59/122* (2023.01)
*H10K 59/80* (2023.01)

(52) U.S. Cl.
CPC ......... *H10K 59/131* (2023.02); *H10K 50/844* (2023.02); *H10K 59/122* (2023.02); *H10K 59/80521* (2023.02)

(58) Field of Classification Search
CPC ............... H10K 50/813; H10K 59/122; H10K 59/131–1315; H10K 59/80521
See application file for complete search history.

(56) References Cited

U.S. PATENT DOCUMENTS

| | | | |
|---|---|---|---|
| 2006/0273996 A1* | 12/2006 | Ozawa | H10K 59/122 345/76 |
| 2017/0083139 A1 | 3/2017 | Kim et al. | |
| 2018/0188837 A1 | 7/2018 | Son et al. | |
| 2020/0212116 A1* | 7/2020 | Kim | G06F 3/04166 |

FOREIGN PATENT DOCUMENTS

| | | |
|---|---|---|
| KR | 10-2016-0094257 A | 8/2016 |
| KR | 10-2018-0077747 A | 7/2018 |

* cited by examiner

*Primary Examiner* — Daniel P Shook
(74) *Attorney, Agent, or Firm* — Morgan, Lewis & Bockius LLP

(57) ABSTRACT

Disclosed is a light emitting display panel in which a portion overlapped with data lines is patterned in a cathode electrode, and a light emitting display apparatus using the same. The light emitting display panel comprises a substrate, a first signal line along a first direction of the substrate, a first insulating film covering the first signal line, a second insulating film covering the first insulating film, an anode electrode patterned by each pixel, a bank covering ends of the anode electrode, a first light emitting layer on the anode electrode disposed at a first side of the bank, a second light emitting layer on the anode electrode disposed at a second side of the bank, a first cathode electrode on the first light emitting layer, and a second cathode electrode on the second light emitting layer, wherein the first and second cathode electrodes are separated from each other on the upper surface of the bank.

12 Claims, 14 Drawing Sheets

LIGHT EMITTING DISPLAY PANEL AND LIGHT EMITTING DISPLAY APPARATUS USING THE SAME

CROSS-REFERENCE TO RELATED APPLICATIONS

This application claims the benefit of the Korean Patent Application No.—10-2020-0141302 filed on Oct. 28, 2020, which is hereby incorporated by reference as if fully set forth herein.

BACKGROUND

Technical Field

The present disclosure relates to a light emitting display panel and a light emitting display apparatus using the same.

Discussion of the Related Art

A light emitting display apparatus is a display apparatus for outputting light by the use of light emitting device, and the light emitting display apparatus includes a light emitting display panel with light emitting devices.

According as the light emitting display panel displays a high resolution, and the number of masks used in the light emitting display panel is reduced, a resistance-capacitor load (RC Load) in the light emitting display panel is increased, whereby a degradation of an image quality occurs due to a degradation of a charge rate.

In particular, when forming one of two electrodes constituting the light emitting device, a parasitic capacitance is generated between a cathode electrode provided in the form of plate on the entire light emitting display panel and data lines provided along a first direction of the light emitting display panel, whereby a resistance-capacitor load (RC Load) in the data lines and cathode electrode increases, thereby causing a degradation of a picture quality.

SUMMARY

Accordingly, embodiments of the present disclosure are directed to a light emitting display panel and a light emitting display apparatus using the same that substantially obviate one or more of the problems due to limitations and disadvantages of the related art.

An aspect of the present disclosure is to provide a light emitting display panel in which a portion overlapped with data lines is patterned in a cathode electrode, and a light emitting display apparatus using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display panel comprises a substrate, a first signal line disposed along a first direction of the substrate and provided on the substrate, a first insulating film disposed on the substrate and configured to cover the first signal line, a second insulating film configured to cover the first insulating film, an anode electrode disposed on the second insulating film, electrically connected with a driving transistor disposed on the first insulating film, and patterned by each pixel, a bank disposed on the second insulating film while being overlapped with the first signal line and configured to cover ends of the anode electrode, a first light emitting layer disposed on the anode electrode disposed at a first side of the bank with respect to the bank, a second light emitting layer disposed on the anode electrode disposed at a second side of the bank with respect to the bank, a first cathode electrode disposed on the first light emitting layer, and a second cathode electrode disposed on the second light emitting layer, wherein the first cathode electrode and the second cathode electrode are separated from each other on the upper surface of the bank.

In another aspect, a light emitting display apparatus comprises the above-described light emitting display panel, a data driver configured to supply data voltages to data lines disposed in the light emitting display panel, a gate driver configured to supply gate voltages to gate lines disposed in the light emitting display panel, and a controller configured to control the data driver and the gate driver.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION OF THE DISCLOSURE

Figure 1:
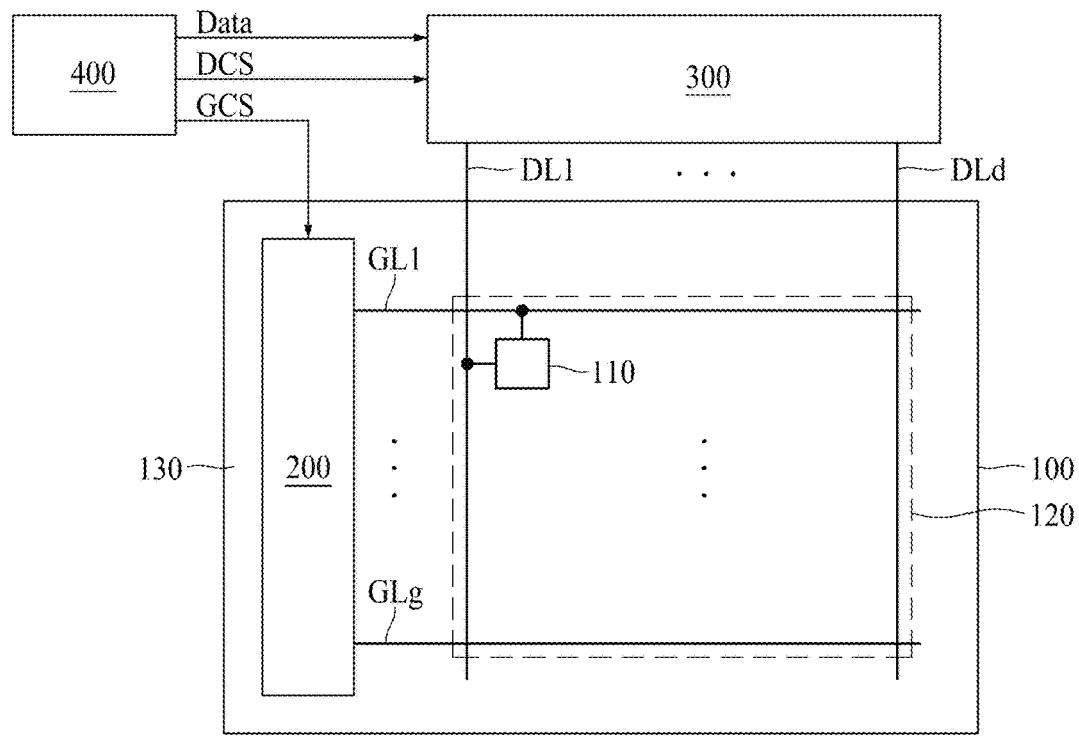
FIG. 1 illustrates a display apparatus according to the present disclosure, and FIG. 2 illustrate a pixel structure applied to the display apparatus according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display panel according to the present disclosure and a display apparatus using the same will be described in detail with reference to the accompanying drawings. In the drawings, the same or similar elements are denoted by the same reference numerals even though they are depicted in different drawings.

Hereinafter, embodiments of the present disclosure will be described in detail with reference to the accompanying drawings.

Figure 2:
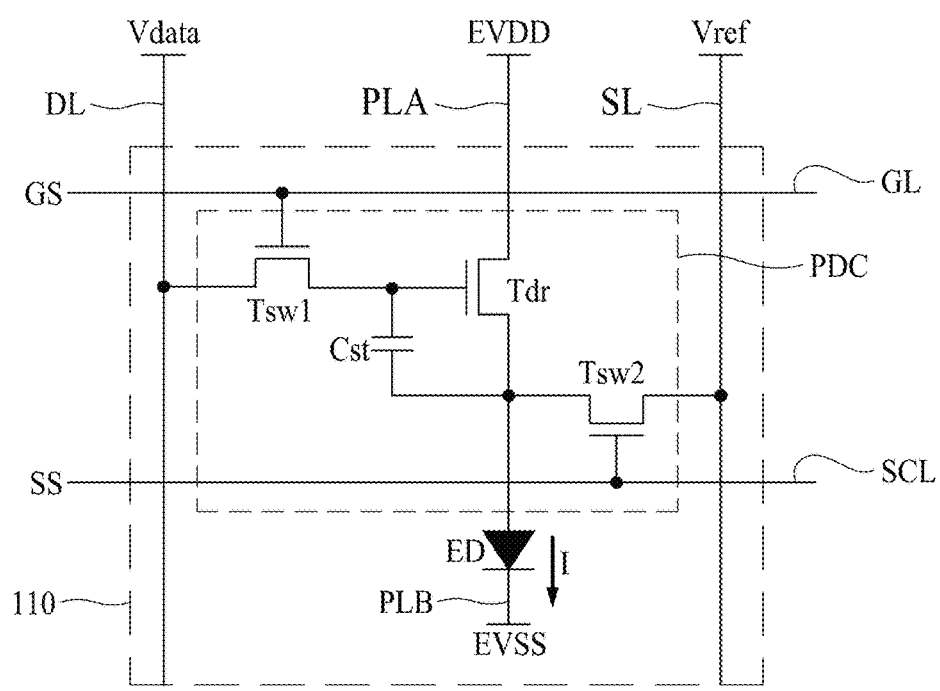

FIG. 1 illustrates a display apparatus according to the present disclosure. FIG. 2 illustrates a pixel structure applied to the display apparatus according to the present disclosure.

The display apparatus according to the present disclosure may constitute various electronic devices. For example, the electronic device may be a smart-phone, a tablet PC, a television, a monitor, and the like.

As shown in FIG. 1, the display apparatus according to the present disclosure includes a light emitting display panel 100 including a display area 120 configured to output an image and a non-display area 130 provided in the periphery of the display area, a gate driver 200 configured to supply gate signals to gate lines GL1 to GLg provided in the display area of the light emitting display panel 100, a data driver 300 configured to supply data voltages to data lines DL1 to DLd provided in the display panel, and a controller 400 configured to control an operation in each of the gate driver 200 and the data driver 300.

The light emitting display panel 100 includes the display area 120 and the non-display area 130. In the display area 120, there are the gate lines GL1 to GLg, the data lines DL1 to DLd, and pixels 110.

As shown in FIG. 2, the pixel 110 provided in the light emitting display panel 100 may include a light emitting device ED, a switching transistor Tsw1, a storage capacitor Cst, a driving transistor Tdr, and a sensing transistor Tsw2. The pixel 110 includes a pixel driving circuit PDC and a light emitting portion, and the pixel driving circuit PDC may include the switching transistor Tsw1, the storage capacitor Cst, the driving transistor Tdr, and the sensing transistor Tsw2. And, the light emitting portion may include the light emitting device ED.

The light emitting device ED may include any one of an organic light emitting layer, an inorganic light emitting layer, and a quantum dot light emitting layer. Alternatively, the light emitting device ED may include a stack or mixed structure of the organic light emitting layer (or inorganic light emitting layer) and the quantum dot light emitting layer.

The switching transistor Tsw1 constituting the pixel driving circuit PDC may be turned on or off by the gate signal GS supplied to the gate line GL. The data voltage Vdata supplied through the data line DL is supplied to the driving transistor Tdr when the switching transistor Tsw1 is turned on. A first voltage EVDD may be supplied to the driving transistor Tdr and the light emitting device ED through a first voltage supply line PLA. And, a second voltage EVSS is supplied to the light emitting device ED through a second voltage supply line PLB. The sensing transistor Tsw2 may be turned on or off by a sense control signal SS supplied through a sensing control line SCL. And, a sensing line SL may be connected to the sensing transistor Tsw2. A reference voltage Vref may be supplied to the pixel 110 through the sensing line SL. The sensing signal related with the characteristic change of the driving transistor Tdr may be transmitted to the sensing line SL through the sensing transistor Tsw2.

Although the light emitting display panel according to the present disclosure may be formed in the structure shown in FIG. 2, the present disclosure is not limited thereto. Accordingly, the light emitting display panel according to the present disclosure may be changed in various types in addition to the structure shown in FIG. 2.

The light emitting display panel 100 may form a pixel area in which the pixels 110 are formed. In the light emitting display panel 100, there are signal lines configured to provide various signals to the pixel driving circuit PDC provided in the pixel 110 of the pixel area.

For example, in the light emitting display panel including the pixel 110, the signal lines may include the gate line GL, the data line DL, the sensing control line SCL, the first voltage supply line PLA, the second voltage supply line PLB, and the sensing line SL.

The data driver 300 may be provided on a chip-on film attached to the light emitting display panel 100. And, the data driver 300 may be connected to a main board provided with the controller 400. In this case, lines for electrically connecting the controller 400/data driver 300 and the light emitting display panel 100 may be provided in the chip-on-film. To this end, the lines are electrically connected to pads provided in the light emitting display panel 100 and the main board. The main board is electrically connected to an external substrate on which an external system is mounted.

The data driver 300 may be directly mounted on the light emitting display panel 100 and may be electrically connected to the main board.

However, the data driver 300 may be formed with one integrated circuit together with the controller 400. And, the integrated circuit may be provided on the chip-on film or directly mounted on the light emitting display panel 100.

The external system performs a function of driving the controller 400 and electronic device. For example, when the electronic device is a smart phone, the external system may receive various voice information, image information, and text information through a wireless communication network, and transmit the received image information to the controller 400. The image information may be input image data.

The data driver 300 may receive the sensing signal related with the characteristic change of the driving transistor Tdr provided in the light emitting display panel from the light emitting display panel, and may transmit the sensing signal to the controller 400.

Next, the gate driver 200 may be composed of an integrated circuit, and then may be integrated with the non-display area 130. Alternatively, the gate driver 200 may be directly embedded in the non-display area 130 by a gate-in-panel (GIP) method. If using the gate-in-panel (GIP) method, transistors constituting the gate driver 200 may be provided in the non-display area 130 through the same process as transistors provided in each of the pixels 110 of the display area 120.

When a gate pulse generated in the gate driver 200 is supplied to a gate of the switching transistor Tsw1 or Tsw provided in the pixel 110, the switching transistor is turned on. Accordingly, light may be outputted from the pixel. When a gate-off signal is supplied to the switching transistor Tsw1 or Tsw, the switching transistor is turned off. Accordingly, light is not outputted from the pixel. The gate signal GS supplied to the gate line GL includes the gate pulse and the gate-off signal.

The controller 400 may re-align the input image data transmitted from the external system by the use of timing synchronized signal transmitted from the external system. In addition, the controller 400 may include a data aligner configured to supply the re-aligned image data to the data driver 300, a control signal generator configured to generate a gate control signal GCS and a data control signal DCS by the use of timing synchronized signal, an input portion configured to receive the timing synchronized signal and input image data transmitted from the external system and to transmit the received timing synchronized signal and input image data to the data aligner and the control signal generator, and an output portion configured to output the image data Data generated in the data aligner and the control signals DCS and GCS generated in the control signal generator to the data driver 300 or the gate driver 200.

The controller 400 may be embedded in the light emitting display panel 100 or may be attached to the light emitting display panel 100. Alternatively, the controller 400 may further perform a function of analyzing touch sensing signals received through a touch panel and sensing whether or not there is a touch and a touch position.

Hereinafter, as shown in FIG. 2, the light emitting display panel including the light emitting device ED is described as an example of the light emitting display panel according to the present disclosure.

Figure 3:
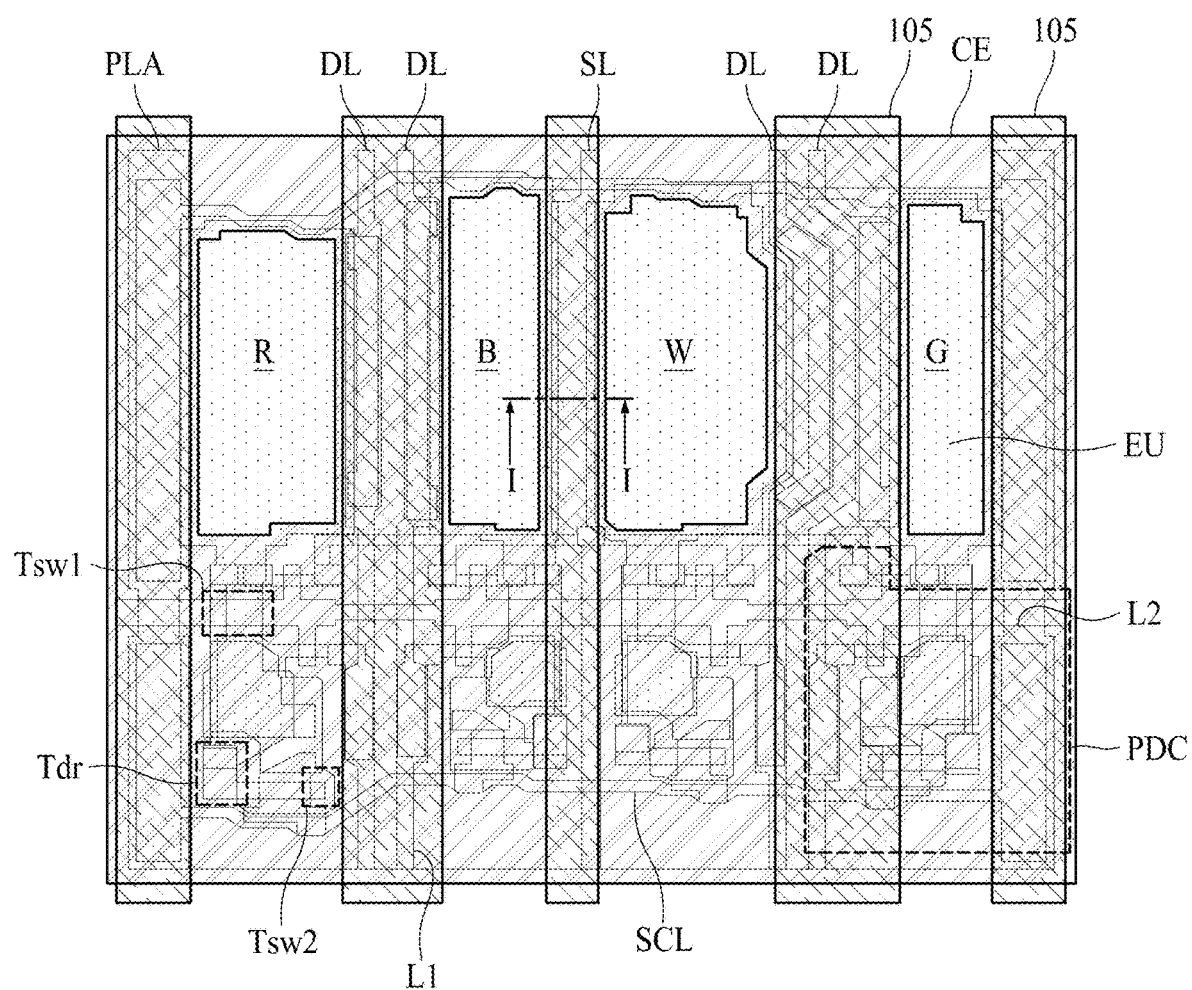
FIG. 3 illustrates four pixels of a light emitting display panel according to the present disclosure.
Figure 4A:
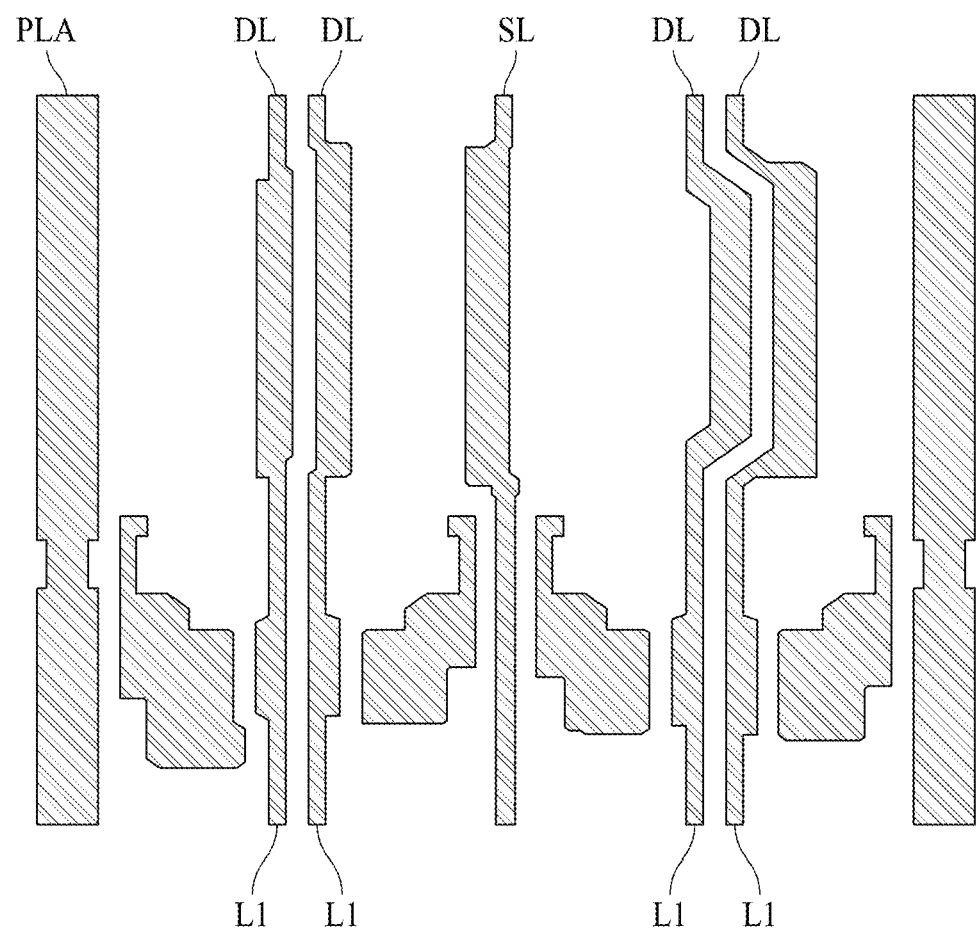
FIG. 4A illustrates first panel electrodes provided in the pixels shown in FIG. 3.
Figure 4B:
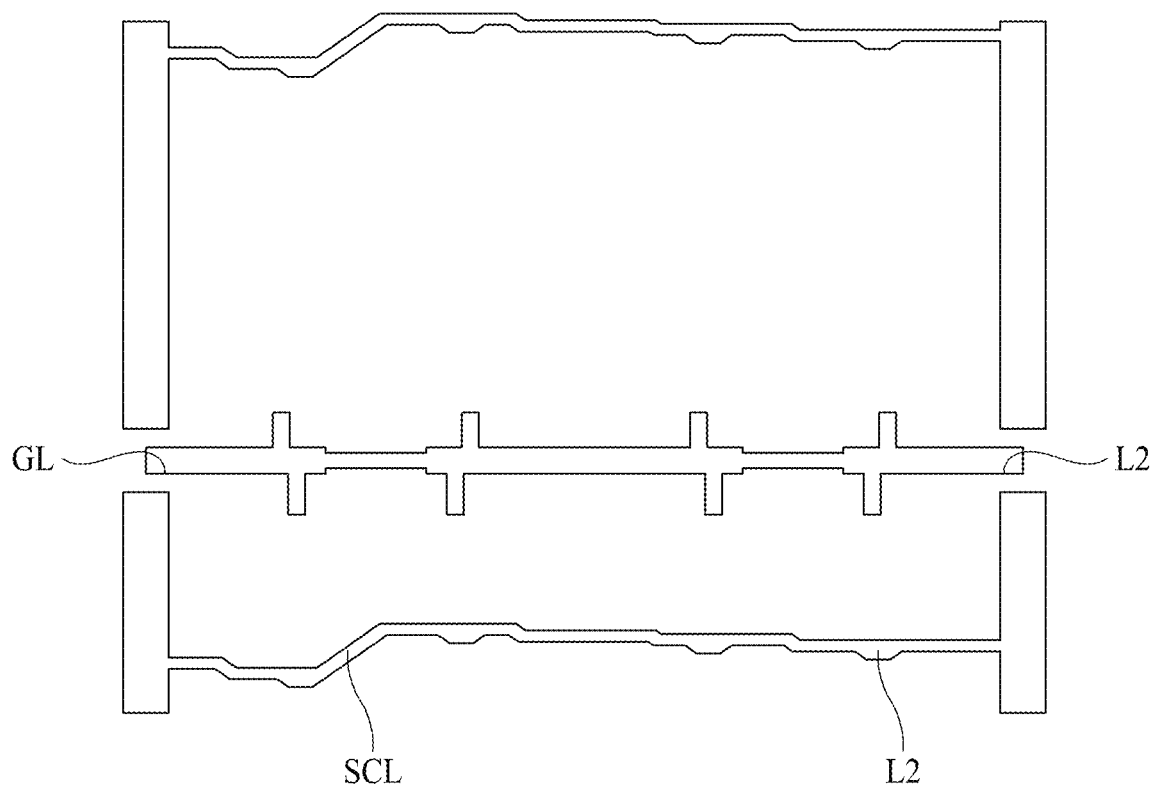
FIG. 4B illustrates second panel electrodes provided in the pixels shown in FIG. 3.
Figure 5:
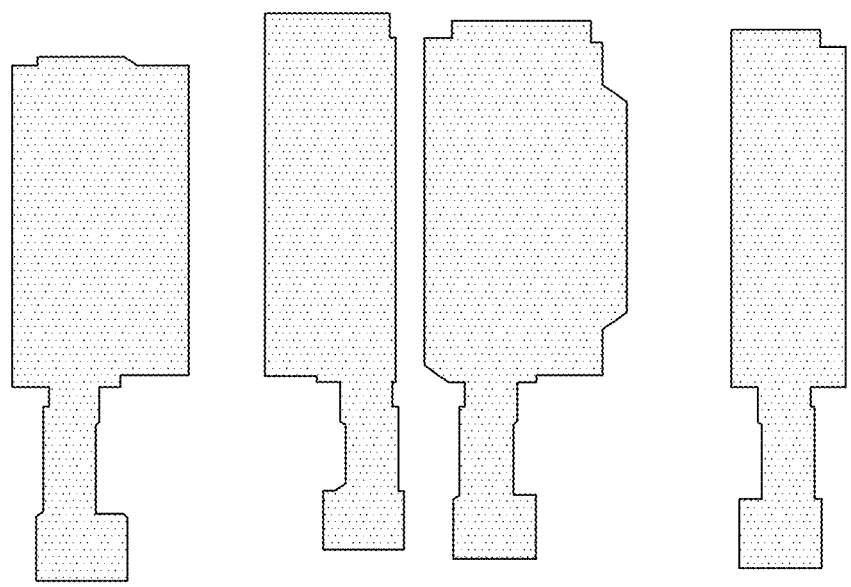
FIG. 5 illustrates third panel electrodes provided in the pixels shown in FIG. 3.
Figure 6:
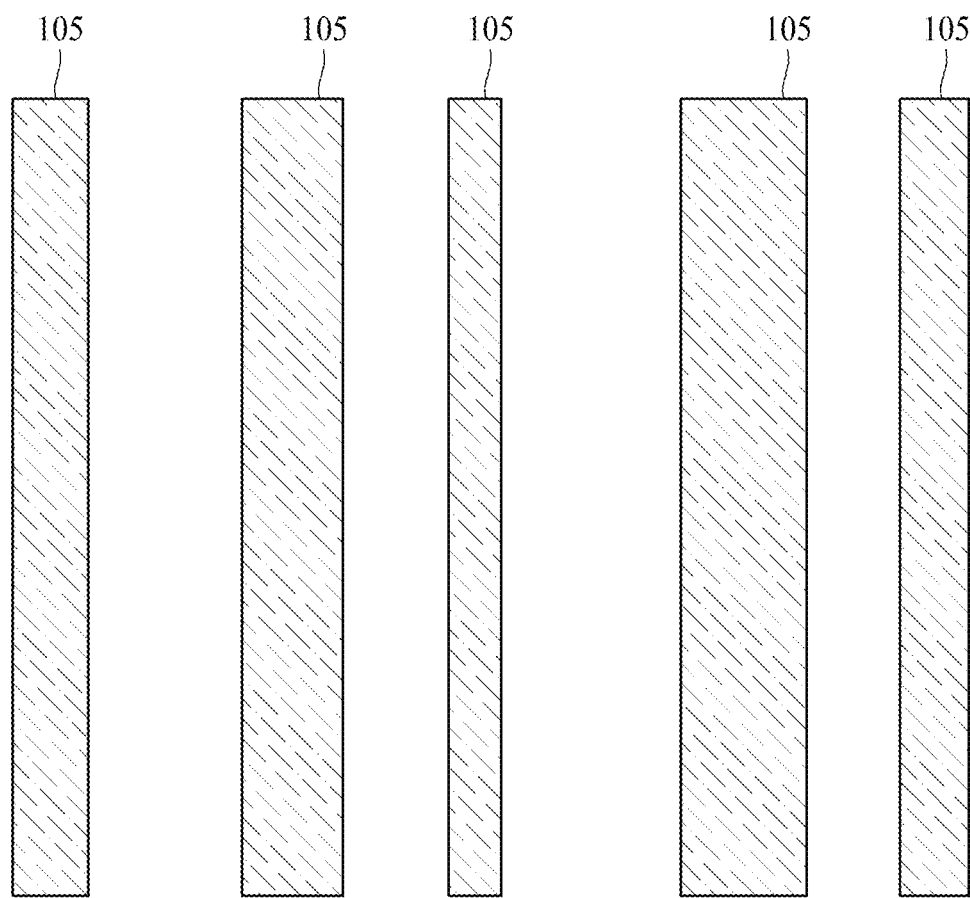
FIG. 6 illustrates partitions provided in the pixels shown in FIG. 3.
Figure 7:
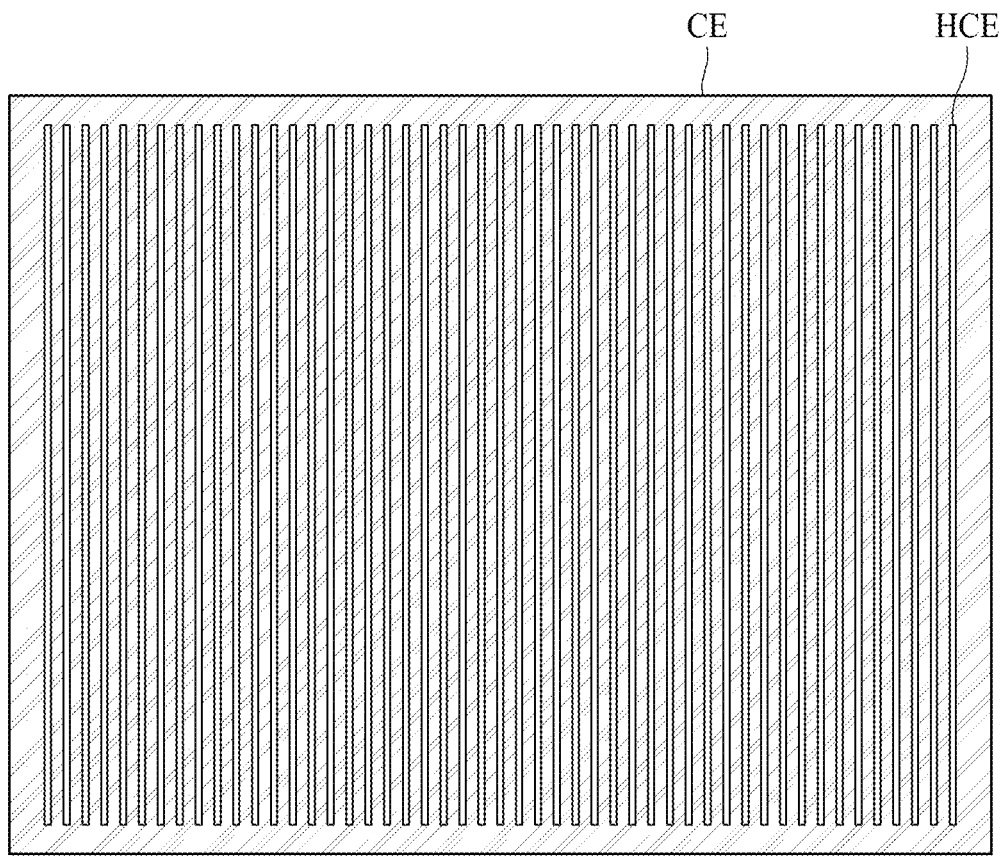
FIG. 7 illustrates a cathode electrode provided in the light emitting display panel according to the present disclosure.
Figure 8:
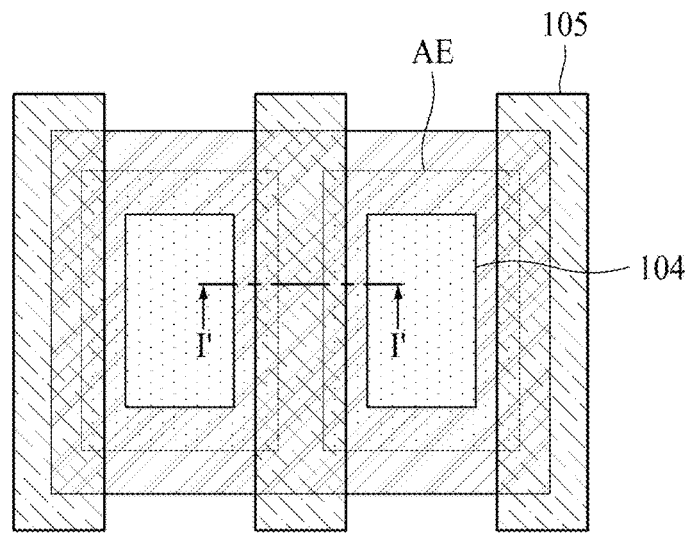
FIG. 8 illustrates two pixels provided in the light emitting display panel according to the present disclosure.
Figure 9:
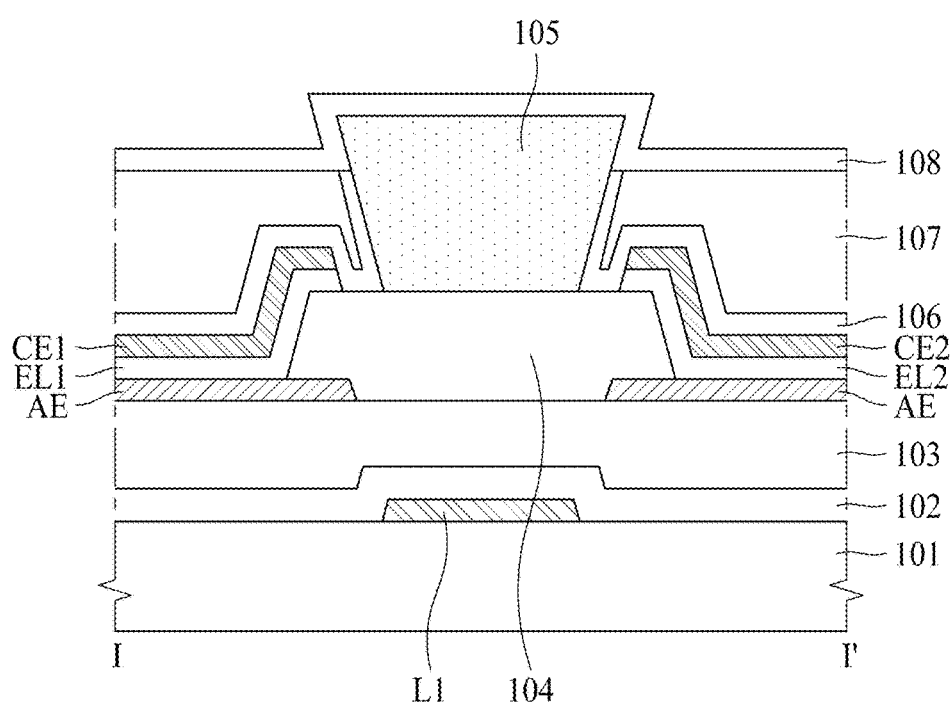
FIG. 9 is a cross sectional view along I-I' shown in FIGS. 3 and 8.

FIG. 3 illustrates four pixels of the light emitting display panel according to the present disclosure. FIG. 4A illustrates first panel electrodes provided in the pixels shown in FIG. 3. FIG. 4B illustrates second panel electrodes provided in the pixels shown in FIG. 3. FIG. 5 illustrates third panel electrodes provided in the pixels shown in FIG. 3. FIG. 6 illustrates partitions provided in the pixels shown in FIG. 3. FIG. 7 illustrates a cathode electrode provided in the light emitting display panel according to the present disclosure. FIG. 8 illustrates two pixels provided in the light emitting display panel according to the present disclosure. FIG. 9 is a cross sectional view along I-I' shown in FIGS. 3 and 8.

As shown in FIGS. 3 to 9, the light emitting display panel according to the present disclosure may include a substrate 101, a first signal line L1 disposed along a first direction of the substrate 101 and provided on the first substrate 101, a first insulating film 102 disposed on the substrate 101 and configured to cover the first signal line L1, a second insulating film 103 configured to cover the first insulating film 102, an anode electrode AE provided on the second insulating film 103, electrically connected with the driving transistor Tdr disposed on the first insulating film 102, and patterned by each pixel, a bank 104 disposed on the second insulating film 103 while being overlapped with the first signal line L1 and configured to cover an end of the anode electrode AE, a first light emitting layer EL1 provided on the anode electrode AE disposed at a first side of the bank 104, a second light emitting layer EL2 provided on the anode electrode AE disposed at a second side of the bank 104, a first cathode electrode CE1 disposed on the first light emitting layer EL1, and a second cathode electrode CE2 disposed on the second light emitting layer EL2. The first cathode electrode CE1 and the second cathode electrode CE2 may be disposed while being separated from each other on an upper surface of the bank 104.

The light emitting display panel according to the present disclosure may include the plurality of pixels 110. Referring to FIG. 3, the four pixels constituting a unit pixel are shown, that is, a red pixel representing a red (R) color, a blue pixel representing a blue (B) color, a white pixel representing a white (W) color, and a green pixel representing a green (G) color.

Each pixel may include the pixel driving circuit PDC, and the light emitting portion EU. Referring to FIG. 2, in the pixel driving circuit PDC for each of the pixels shown in FIG. 3, there are the switching transistor Tsw1, the driving transistor Tdr, and the sensing transistor Tsw2. In this case, the light emitting portion EU may be formed of the light emitting device ED, and the light emitting device ED may be formed of an organic light emitting diode, but not limited to this type. For example, the light emitting device may be formed of an inorganic light emitting diode.

In each of the pixels, there are signal lines configured to supply various signals to the pixel driving circuit PDC. For example, the light emitting display panel may include a data line DL, a gate line GL, a first driving voltage line PLA, a sensing line SL, and a sensing control line SCL.

The first signal line L1 may be any one of the signal lines provided in the light emitting display panel 100 along the first direction (for example, vertical direction) of the light emitting display panel 100. For example, each of the data line DL, the first driving voltage line PLA, and the sensing line SL may be the first signal line L1.

Also, the second signal line L2 may be any one of the signal lines provided in the light emitting display panel 100 along the second direction (the direction different from the first direction) of the light emitting display panel 100. The second direction may be a horizontal direction perpendicular to the first direction. For example, each of the gate line GL and the sensing control line SCL may be the second signal line L2.

The present disclosure may be embodied in that the cathode electrode CE is patterned in the area where the first signal line L1 and the cathode electrode CE are overlapped with each other.

Among the first signal lines overlapped with the cathode electrode CE, the data line DL may be largely influenced by the overlap with the cathode electrode CE. According as the data line DL is overlapped with the cathode electrode CE, a parasitic capacitance may be generated between the data line DL and the cathode electrode CE. Due to the generated parasitic capacitance, a resistance-capacitor load (RC Load) may be generated in the data line DL and the cathode electrode CE, to thereby cause defects on image quality in the light emitting display panel 100.

Hereinafter, the light emitting display panel where the data line DL among the data line DL, the first driving voltage line PLA and the sensing line SL is used as the first signal line L1 is described as an example of the present disclosure.

The substrate 101 may be a glass substrate or a plastic substrate, and may be formed of various kinds of films.

As shown in FIG. 4A, first panel electrodes may be formed on the substrate 101. Some of the first panel electrodes may be the data line DL used as the first signal line L1. The first signal line L1, which is one of the first panel electrodes, is illustrated in FIG. 4A, and the first signal line L1 may be the data line DL.

The data voltage Vdata generated from the data driver 300 may be supplied to the data line DL. The data voltage Vdata may be supplied to the transistor provided in the pixel driving circuit. For example, as shown in FIG. 2, the data voltage Vdata may be supplied to the switching transistor Tsw1.

The first signal line L1 may be disposed in the first direction of the substrate 101. For example, the first signal line L1 may be provided along the vertical direction of the light emitting display panel shown in FIG. 1.

The first signal line L1 may be covered by the first insulating film 102.

The first insulating film 102 may include a buffer which contacts the first signal line L1, and a gate insulating film which covers the buffer.

The buffer may be provided on the substrate 101, and may be provided on the entire display area of the substrate 101.

The gate insulating film may be formed on an upper surface of the buffer. The gate insulating film may insulate an active for the driving transistor Tdr provided in the pixel driving circuit PDC from a gate electrode of the driving transistor Tdr provided in the pixel driving circuit PDC. The gate insulating film may be disposed to cover the active on the buffer. And, the gate electrode for the driving transistor Tdr may be disposed on the gate insulating film.

The buffer may be formed of at least one inorganic film or at least one organic film. Alternatively, the buffer may be formed by stacking at least one inorganic film and at least one organic film.

The gate insulating film may be formed of at least one inorganic film or at least one organic film. Alternatively, the gate insulating film may be formed by stacking at least one inorganic film and at least one organic film. As shown in FIG. 4B, second panel electrodes may be formed on the first insulating film 102. The second panel electrode may be the second signal line L2, and the second signal line L2 may be the gate line GL or the sensing control line SCL.

The second insulating film 103 may cover the first insulating film 102 and the second panel electrodes.

The second insulating film 103 may include a protection film configured to insulate second panel lines from other metal lines, and a planarization film configured to planarize an upper surface of the protection film.

For example, various kinds of transistors and signal lines constituting the pixel driving circuit PDC may be provided between the first insulating film 102 and the second insulating film 103. In this case, the various kinds of transistors and signal lines may have the different thicknesses, and the thickness of the area in which the transistors and the signal lines are provided may be different from the thickness of the area in which the transistors and the signal lines are not provided.

Due to the step difference, an upper surface formed by the transistors and the signal lines may be uneven. Thus, an upper surface of the protection film covering the transistors and the signal lines may be uneven.

The planarization film is formed on the upper surface of the protection film and is configured to planarize the uneven upper surface. The planarization film is configured to have a height greater than that of the protection film.

The protection film may be formed of at least one inorganic film.

The planarization film may be formed of at least one organic film or may be formed in a stack structure of at least one inorganic film and at least one organic film.

As shown in FIG. 5, third panel electrodes may be formed on the second insulating film 103. Some of the third panel electrodes may form the anode electrode AE for the light emitting portion EU.

For example, the anode electrode AE may be provided on the second insulating film 103. Also, the anode electrode AE may be electrically connected to the driving transistor Tdr disposed on the substrate. And, the anode electrode AE may be patterned by each pixel.

The anode electrode AE may be one of the two electrodes constituting the light emitting device ED. For example, if the light emitting device ED is an organic light emitting diode, the organic light emitting diode may include a first pixel electrode, a light emitting layer disposed on an upper surface of the first pixel electrode, and a second pixel electrode provided on an upper end of the light emitting layer. The first pixel electrode may be the anode electrode AE, and the second pixel electrode may be the cathode electrode CE. In this case, the anode electrode AE is connected with the driving transistor Tdr.

The anode electrode AE disposed on the second insulating film 103 may be electrically connected to the transistor disposed on the first insulating film 102. For example, the anode electrode AE may be electrically connected to the driving transistor Tdr.

The anode electrode AE may be formed of a transparent electrode of ITO or IZO, or may be formed of an opaque electrode of copper (Cu). The anode electrode AE may be formed in a stack structure of a transparent electrode and an opaque electrode.

The anode electrode AE may be covered by the bank 104 configured to form an opening through which light is output.

The bank 104 is disposed on the second insulating film 103, and may be overlapped with the first signal line L1. For example, the bank 104 may overlap the first signal line L1 with the second insulating film 103 interposed in-between. As shown in FIG. 8, the bank 104 covers the end of the anode electrode AE.

The bank 104 covers the ends of the anode electrode AE, and the bank 104 includes an opening portion configured to expose an upper surface of the anode electrode AE. Also, the bank 104 may be disposed on the display area of the substrate 101. And, the bank 104 may be provided on the entire display area. The bank 104 may prevent light from being overlapped between the neighboring pixels.

The bank 104 may be formed of at least one inorganic film or at least one organic film. Alternatively, the bank 104 may be formed by stacking at least one inorganic film and at least one organic film.

With respect to the bank 104, the first light emitting layer EL1 may be provided on the anode electrode AE provided at the first side of the bank 104. And, with respect to the bank 104, the second light emitting layer EL2 may be provided on the anode electrode AE provided at the second side of the bank 104. The first side of the bank 104 may be the left side of the bank 104, and the second side of the bank 104 may be the right side of the bank 104.

For example, referring to FIG. 9, the first light emitting layer EL1 may be provided at the left side of the bank 104, and the second light emitting layer EL2 may be provided at the right side of the bank 104.

The first light emitting layer EL1 and the second light emitting layer EL2 may be formed of the same material. Each of the first light emitting layer EL1 and the second light emitting layer EL2 may include any one of an organic light emitting layer, an inorganic light emitting layer and a quantum dot light emitting layer. Alternatively, each of the first light emitting layer EL1 and the second light emitting layer EL2 may have a deposition or stack structure of an organic light emitting layer (or inorganic light emitting layer) and a quantum dot light emitting layer.

The first cathode electrode CE1 may be provided on the first light emitting layer EL1, and the second cathode electrode CE2 may be disposed on the second light emitting layer EL2.

The first cathode electrode CE1 and the second cathode electrode CE2 may be formed of the same material. For example, the first cathode electrode CE1 and the second cathode electrode CE2 may be formed of a transparent electrode such as ITO and IZO, and may be formed of an opaque electrode such as copper (Cu). Alternatively, the first cathode electrode CE1 and the second cathode electrode CE2 may be formed in a stack structure of the transparent electrode and the opaque electrode.

In the present invention, the first cathode electrode CE1 and the second cathode electrode CE2 are separated from each other on the bank 104.

As shown in FIGS. 6, 8 and 9, a partition 105 may be additionally provided while being overlapped with the first signal line L1. The first light emitting layer EL1 and the first cathode electrode CE1 are separated from the second light emitting layer EL2 and the second cathode electrode CE2 by the partition 105 on the upper surface of the bank 104.

Thus, the cathode electrode CE is not provided in an area overlapping the first signal line L1 on the upper surface of the bank 104. Referring to FIG. 9, the first cathode electrode CE1 and the second cathode electrode CE2 may be spaced apart from each other on the bank 104 so as not to overlap the first signal line L1.

Accordingly, on the upper surface of the bank 104, a parasitic capacitance due to the overlap of the first signal line L1 and the cathode electrode CE is not generated in an area overlapping the first signal line L1. Therefore, a RC load of a cathode voltage transmitted along the cathode electrode CE or the data voltage Vdata transmitted along the data line DL corresponding to the first signal line L1 may be reduced. The cathode voltage may be the second voltage EVSS supplied to the light emitting device ED through the second voltage supply line PLB.

As the cathode electrode CE is spaced apart from each other on the upper surface of the bank 104 so as not to overlap the first signal line L1, the RC load of the data line DL or the cathode electrode CE in the light emitting display panel according to the present invention may be reduced as compared to the RC load of the data line DL or the cathode electrode CE in the related art display panel in which the first signal line L1 overlaps the cathode electrode. Accordingly, in the present invention, a degradation of image quality of the light emitting display panel due to RC load may be reduced.

As described above, due to the increase in RC load according to high resolution and mask reduction, a reduction in charge rate may occur in the related art display panel. Accordingly, in the related art display panel, an image quality defect due to the increase in RC load may be generated.

For example, the RC load is increased by the parasitic capacitance generated between the cathode electrode CE provided on the upper surface of the bank 104 and the data line DL overlapped with the cathode electrode CE. In order to prevent this, it is necessary to reduce the overlapping area between the data line and the cathode electrode.

Therefore, in the present invention, the cathode electrode CE is not provided in the area overlapping the first signal line L1 on the upper surface of the bank 104. For example, the cathode electrode CE may be spaced apart from each other so that the cathode electrode CE is not overlapped with the first signal line L1 on the upper surface of the bank 104.

Also, in the present invention, the light emitting layer may be separated by the partition 105 in the area overlapping the first signal line L1 on the upper surface of the bank 104. For example, the light emitting layer may be disposed to be spaced apart by the partition 105 overlapped with the first signal line L1 on the bank 104. Referring to FIG. 9, in case of the light emitting layer, the first light emitting layer EL1 provided on the anode electrode AE disposed at the first side of the bank 104 may be separated from the second light emitting layer EL2 provided on the anode electrode AE disposed at the second side of the bank 104 by the use of partition 105.

Therefore, the leakage current flowing into the second light emitting layer EL2 from the first light emitting layer EL1 is not generated. Also, the leakage current flowing into the first light emitting layer EL1 is not generated in the second light emitting layer EL2. In the present invention, the leakage current flowing into the adjacent pixels through the light emitting layer is not generated. Accordingly, a brightness of light output from each pixel is not affected by the adjacent pixels.

Referring to FIG. 9, the first cathode electrode CE1, the first lateral surface of the partition 105 provided at the first side, the second lateral surface of the partition 105 provided at the second side, the upper surface of the bank 104 exposed between the first cathode electrode CE1 and the partition 105, the upper surface of the bank 104 exposed between the second cathode electrode CE2 and the partition 105, and the second cathode electrode CE2 may be covered by a third insulating film 106.

In this case, the third insulating film 106 may not be formed on an upper end of the first lateral surface of the partition 105, an upper end of the second lateral surface of the partition 105, and an upper surface of the partition 105. Accordingly, the upper end of the first lateral surface of the partition 105, the upper end of the second lateral surface of the partition 105, and the upper surface of the partition 105 are not covered by the third insulating film 106.

A width of the upper surface of the partition 105 may be greater than a width of the lower surface of the partition 105. When the width of the upper surface of the partition 105 is greater than the width of the lower surface of the partition 105, the first light emitting layer EL1 and the first cathode electrode CE1 provided at the first side may be easily separated from the second light emitting layer EL2 and the second cathode electrode CE2 provided at the second side by the use of partition 105.

The third insulating film 106 may be covered by an encapsulation film 107. As shown in FIG. 9, the encapsulation film 107 may be formed in such a way that an upper end area of the first lateral surface of the partition 105 in the third insulating film 106, an upper end area of the second lateral surface of the partition 105 in the third insulating film 106, and the upper surface of the partition 105 in the third insulating film 106 may be exposed. And, the encapsulation film 107 may cover the third insulating film 106. This shape may be formed by simultaneously etching the third insulating film 106 and the encapsulation film 107 in a manufacturing process of the light emitting display panel. This will be described in a following explanation for the manufacturing process with reference to FIGS. 10A to 10F.

The third insulating film 106, the encapsulation film 107, and the partition 105 may be covered by a fourth insulating film 108.

Each of the third insulating film 106, the encapsulation film 107, and the fourth insulating film 108 may be formed of at least one inorganic film or at least one organic film. Alternatively, each of the third insulating film 106, the encapsulation film 107, and the fourth insulating film 108 may be formed in a stack structure of at least one inorganic film and at least one organic film.

The partition 105 may extend in the first direction, as shown in FIGS. 6 and 8. FIG. 6 illustrates partitions provided in the pixels shown in FIG. 3.

The cathode electrode CE may be spaced apart from the partition 105. For example, the first cathode electrode CE1 is disposed on the upper surface of the bank 104 and is configured to be spaced apart from the first lateral surface of the partition 105. Accordingly, the upper surface of the bank 104 located between the first cathode electrode CE1 and the first lateral surface of the partition 105 may be exposed. And, the upper surface of the exposed bank 104 is covered by the third insulating film 106. The second cathode electrode CE2 is disposed on the upper surface of the bank 104 and is configured to be spaced apart from the second lateral surface of the partition 105. Accordingly, the upper surface of the bank 104 located between the second cathode electrode CE2 and the second lateral surface of the partition 105 may be exposed. And, the upper surface of the exposed bank 104 is covered by the third insulating film 106. Accordingly, as shown in FIG. 7, the cathode electrode CE provided on the entire display area of the light emitting display panel may be patterned to be spaced apart from each other on the bank 104. For example, the cathode electrode CE formed in the display area of the substrate may be patterned to be spaced apart from each other with respect to the partition 105 disposed in the bank 104.

As shown in FIG. 7, a cathode electrode hole HCE may be formed in a portion corresponding to the partition 105 in the cathode electrode CE. The cathode electrode hole HCE is overlapped with the partition 105.

The partition 105 may be overlapped with the first signal line L1. For example, the partition 105 may be overlapped with the data lines DL. Accordingly, the cathode electrode hole HCE may be overlapped with the data line DL.

FIGS. 10A through 10F are exemplary views illustrating a method for manufacturing the light emitting display panel shown in FIG. 9. In the following description, the same or similar content as described with reference to FIGS. 1 to 9 is omitted or briefly described.

Figure 10A:
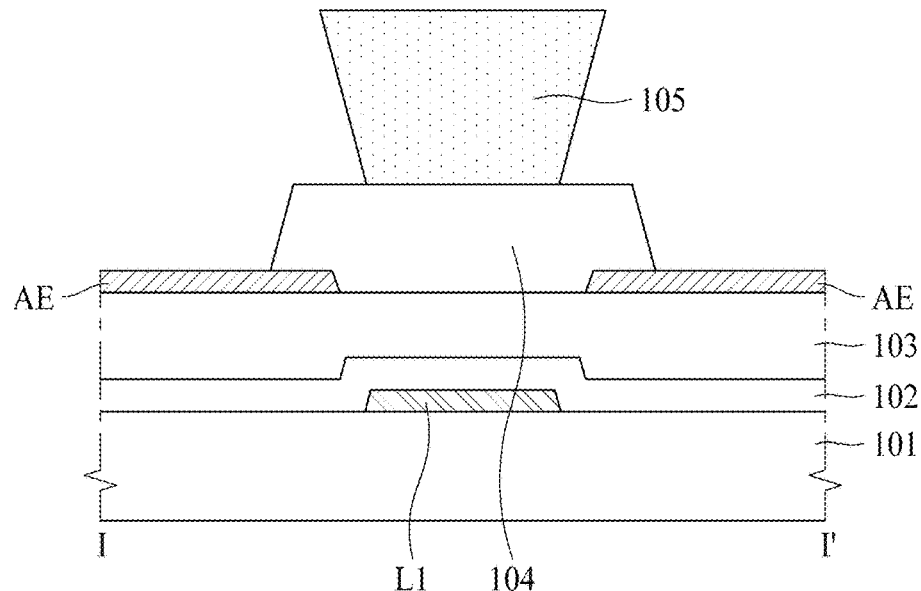
FIGS. 10A to 10F illustrate a method for manufacturing the light emitting display panel shown in FIG. 9.

As shown in FIG. 10A, the first signal line L1, that is, the data line DL is provided on the substrate 101, the first signal line L1 is covered by the first insulating film 102, the first insulating film 102 is covered by the second insulating film 103, the anode electrode AE is patterned on the second insulating film 103, and the ends of the anode electrode AE are covered by the bank 104.

The bank 104 is formed on the second insulating film 103 and is configured to be overlapped with the first signal line L1.

The partition 105 is formed in the area overlapping the first signal line L1 on the upper surface of the bank 104.

Then, a material for the light emitting layer configured to form the first light emitting layer EL1 and the second light emitting layer EL2 is provided on the entire surface of the substrate 101 so as to cover the anode electrodes AE1, the bank 104, and the partition 105.

Figure 10B:
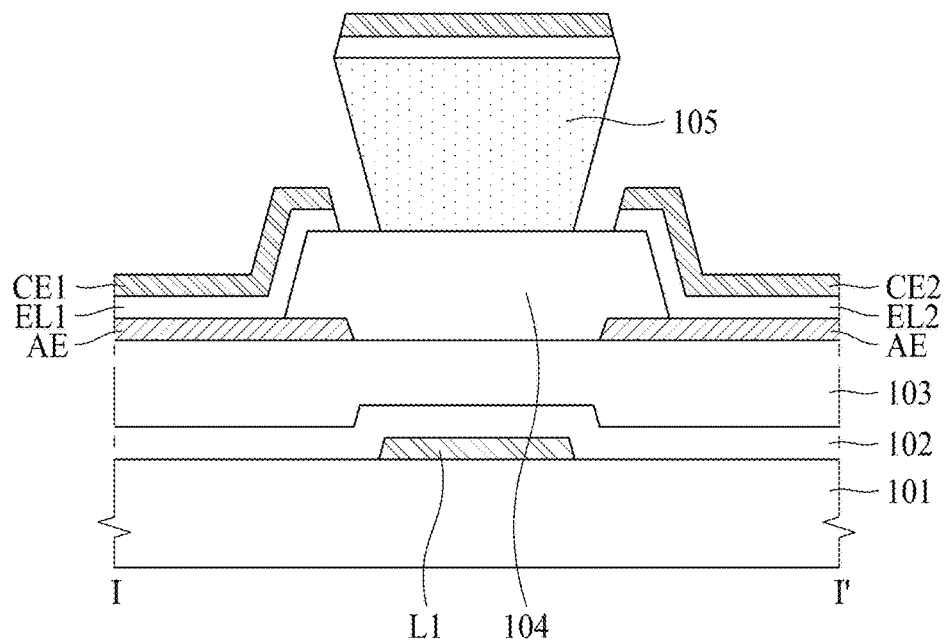

In this case, as described above, since the width of the upper surface of the partition 105 is greater than the width of the lower surface of the partition 105, as shown in FIG. 10B, the light emitting layer material provided on the upper surface of the partition 105 and the light emitting layer material provided on the upper surface of the bank 104 may be separated from each other. Accordingly, the first light emitting layer EL1 and the second light emitting layer EL2 are spaced apart from each other with the partitions 105 therebetween.

A cathode metal for forming the first cathode electrode CE1 and the second cathode electrode CE2 is provided on the entire upper surface of the light emitting layer material.

In this case, in the same manner as the above-explained principle related with the material for the light emitting layer, the cathode metal provided on the upper surface of the partition 105 and the cathode metal provided on the upper surface of the bank 104 may be separated from each other, as shown in FIG. 10B. Accordingly, the first cathode electrode CE1 and the second light emitting layer EL2 are spaced apart from each other with the partition 105 therebetween.

Figure 10C:
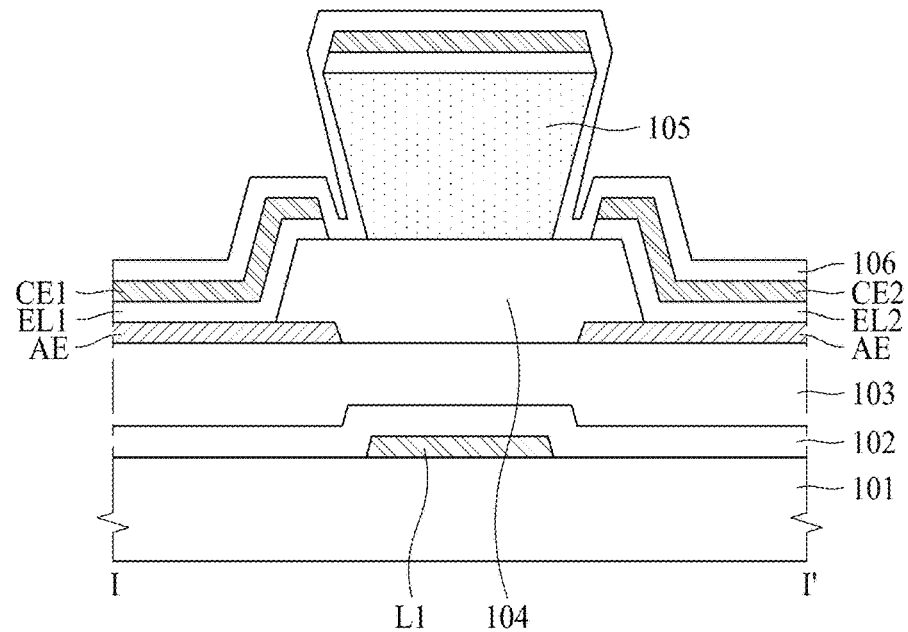

Next, as shown in FIG. 10C, the first cathode electrode CE1, the partition 105, the upper surface of the bank 104 exposed between the first cathode electrode CE1 and the partition 105, the upper surface of the bank 104 exposed between the second cathode electrode CE2 and the partition 105, and the second cathode electrode CE2 are covered by the third insulating film 106.

Figure 10D:
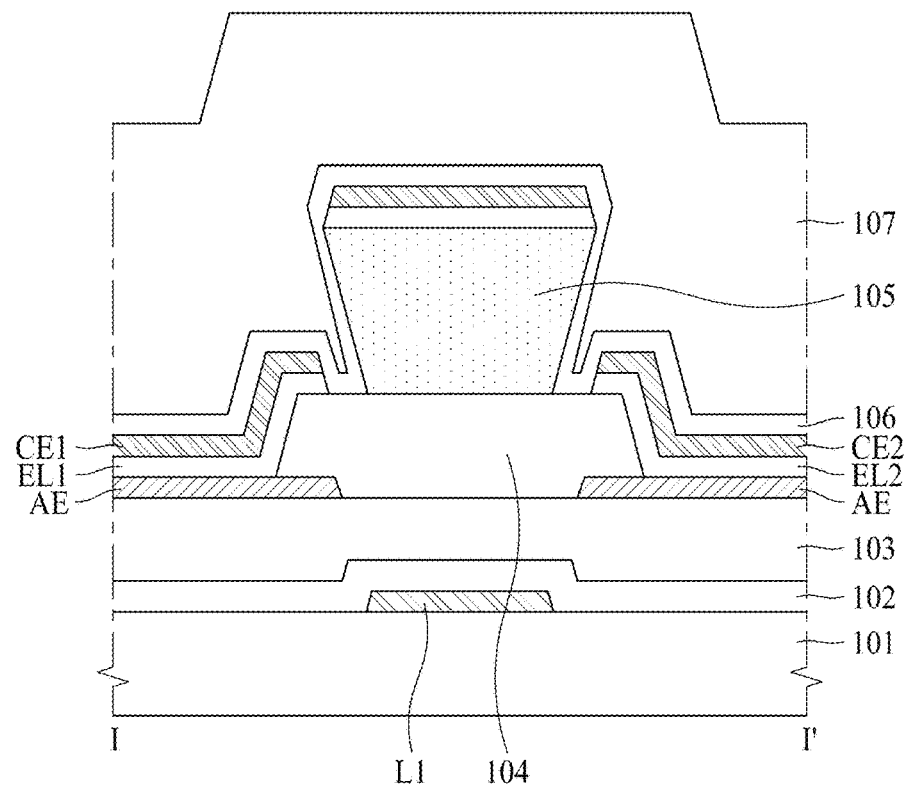

Then, as shown in FIG. 10D, the third insulating film 106 is covered by the encapsulation film 107.

Figure 10E:
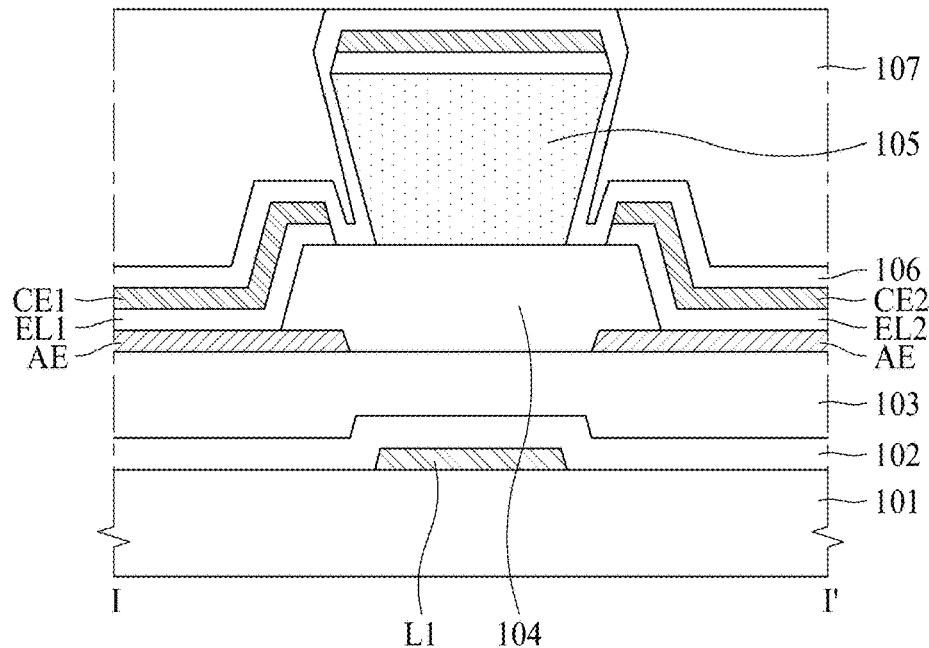

Next, as shown in FIG. 10E, a portion of the encapsulation layer 107 may be etched by a first etching process using a mask and a dry etch so that the third insulating film 106 provided on the upper surface of the partition 105 may be exposed. A halftone mask may be used in the first etching process.

Figure 10F:
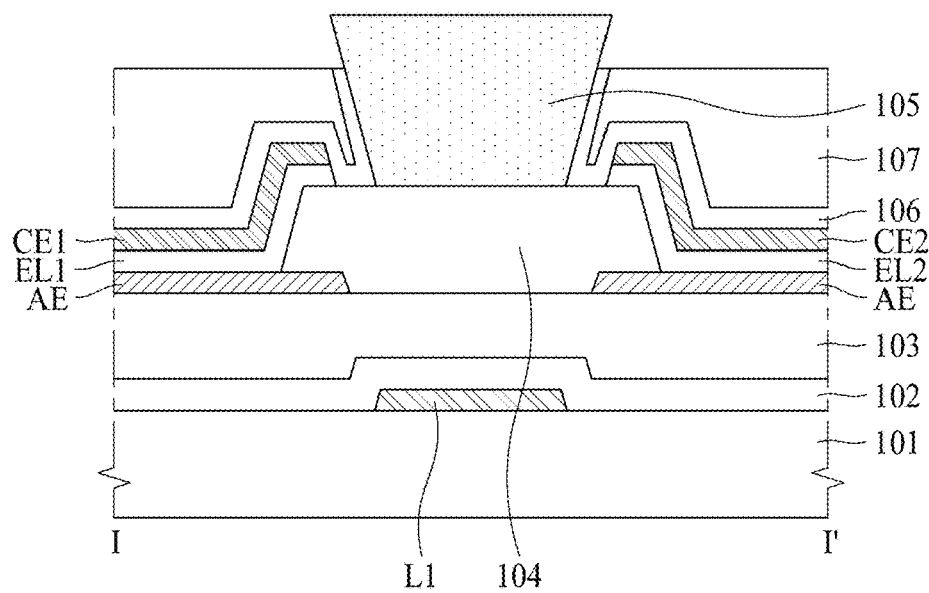

Then, as shown in FIG. 10F, the third insulating film 106 provided on the upper surface of the partition 105, the upper end of the first lateral surface of the partition 105, and the upper end of the second lateral surface of the partition 105 may be etched by a second etching process using a mask and a dry etching, and the upper surface of the encapsulation layer 107 may also be etched. A halftone mask may be used in the second etching process.

Through the second etching process, as shown in FIGS. 9 and 10F, a portion provided on the first and second lateral surfaces of the partition 105 of the third insulating film 106 may be formed in an exposed shape by the encapsulation layer 107.

Finally, as the third insulating film 106, the encapsulation layer 107, and the partition 105 are covered by the fourth insulating film 108, the light emitting display panel with the cross section as shown in FIG. 9 may be manufactured.

Figure 11:
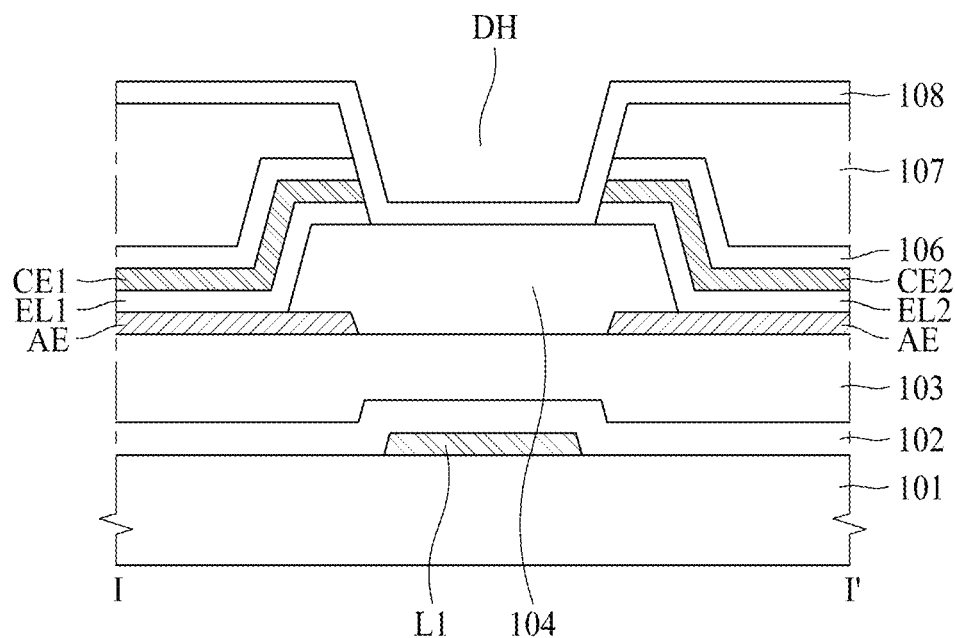
FIG. 11 illustrates a light emitting display panel according to another embodiment of the present disclosure.

FIG. 11 is a cross sectional view of another light emitting display panel according to another embodiment of the present invention, and more particularly, FIG. 11 shows a cross section of another light emitting display panel according to the present invention in a direction corresponding to I-I' line of FIG. 3 or I-I' line of FIG. 8. In the following description, the same or similar content as described with reference to FIGS. 1 to 10F is omitted or briefly described.

As described with reference to FIGS. 1 to 10F, the light emitting display panel according to the present disclosure includes a substrate 101, a first signal line L1 provided on the substrate 101 and provided along a first direction of the substrate 101, a first insulating film 102 provided on the substrate 101 and configured to cover the first signal line L1, a second insulating film 103 configured to cover the first insulating film 102, an anode electrode AE provided on the second insulating film 103, electrically connected with a driving transistor Tdr provided in the first insulating film 102 and patterned by each pixel, a bank 104 provided on the second insulating film 103 while being overlapped with the first signal line L1 and configured to cover ends of the anode electrode AE, a first light emitting layer EL1 provided on the anode electrode AE provided at a first side of the bank 104 with respect to the bank 104, a second light emitting layer EL2 provided on the anode electrode AE provided at a second side of the bank 104 with respect to the bank 104, a first cathode electrode CE1 provided on the first light emitting layer EL1, and a second cathode electrode CE2 provided on the second light emitting layer EL2.

In this case, the first cathode electrode CE1 and the second cathode electrode CE2 are separated from each other on an upper surface of the bank 104, as shown in FIGS. 9 and 11.

The first light emitting layer EL1 and the first cathode electrode CE1 are also separated from the second light emitting layer EL2 and the second cathode electrode CE2 on the upper surface of the bank 104, as shown in FIGS. 9 and 11.

The first cathode electrode CE1 and the second cathode electrode CE2 are covered by a third insulating film 106. The third insulating film 106 may be formed of at least one inorganic film or at least one organic film, and may be formed of at least one inorganic film and at least one organic film. As shown in FIGS. 9 and 11, the third insulating film 106 is separated from each other on the upper surface of the bank 104.

The third insulating film 106 is covered by an encapsulation layer 107. The encapsulation layer 107 may be formed of at least one inorganic film or at least one organic film, and may be formed of at least one inorganic film and at least one organic film. As shown in FIGS. 9 and 11, the encapsulation layer 107 is separated from each other on the upper surface of the bank 104.

Thus, as shown in FIG. 11, on the upper surface of the bank 104, there is a separation hole DH formed by the encapsulation film 107 separated from each other, the third insulating film 106 separated from each other, the first cathode electrode CE1, the second cathode electrode CE2, the first light emitting layer EL1 and the second light emitting layer EL2.

In this case, an exposed surface exposed by the encapsulation film 107 in the upper surface of the bank 104 and the encapsulation film 107 are covered by a fourth insulating film 108.

That is, the fourth insulating film 108 covers the upper surface of the encapsulation film 107 and the separation hole DH. In particular, the fourth insulating film 108 covers surfaces exposed by the separation hole DH, for example, a portion of the upper surface of the bank 104, a lateral surface of the first light emitting layer EL1, a lateral surface of the second light emitting layer EL2, a lateral surface of the first cathode electrode CE1, a lateral surface of the second cathode electrode CE2, a lateral surface of the third insulating film 106, and a lateral surface of the encapsulation film 107.

In addition, the fourth insulating film 108 may be provided on the entire surface of the substrate 101.

The fourth insulating film 108 may be formed of at least one inorganic film or at least one organic film, and may be formed of at least one inorganic film and at least one organic film.

The separation hole DH is overlapped with the first signal line L1 provided in a lower end of the bank 104.

The first signal line L1 extends in the first direction. Accordingly, the separation hole DH may extend in the first direction.

Also, the cathode electrode CE is not formed in the area for the separation hole DH. Thus, the cathode electrode CE provided on the entire substrate 101 of the light emitting display panel may be patterned, as shown in FIG. 7.

That is, as shown in FIG. 7, a cathode electrode hole HCE is formed in the area corresponding to the separation hole DH in the cathode electrode CE, as shown in FIG. 7, whereby the cathode electrode hole HCE is overlapped with the separation hole DH.

Also, the separation hole DH is overlapped with the first signal line L1, that is, the data line DL, whereby the cathode electrode hole HCE is overlapped with the data line DL.

Thus, the cathode electrode CE is not provided in the area overlapped with the first signal line L1 on the upper surface of the bank 104.

Accordingly, a parasitic capacitance caused by the overlap between the first signal line L1 and the cathode electrode CE is not generated in the area overlapped with the first signal line L1 on the upper surface of the bank 104, whereby a RC load of a data voltage Vdata transmitted along the data line DL corresponding to the first signal line L1 or a cathode voltage transmitted along the cathode electrode CE may be reduced.

That is, on the upper surface of the bank 104, in case of the area overlapped with the first signal line L1, the first signal line L1 is not overlapped with the cathode electrode CE. Thus, the RC load in each of the data line DL and the cathode electrode CE in the light emitting display panel according to the present disclosure may be reduced as compared to the RC load in each of the data line DL and the cathode electrode CE in the related art display panel in which the cathode electrode is formed in the area overlapped with the first signal line L1 on the upper surface of the bank 104. Accordingly, in the present invention, image quality defects due to RC load may be reduced.

Also, in the present disclosure, the light emitting layer is separated by the separation hole DH in the area overlapped with the first signal line L1 on the upper surface of the bank 104. That is, the first light emitting layer EL1 provided on the anode electrode AE provided at the first side of the bank 104 and the second light emitting layer EL2 provided on the anode electrode AE provided at the first side of the bank 104 are separated from each other by the separation hole DH.

Therefore, a leakage current transmitted from the first light emitting layer EL1 to the second light emitting layer EL2 is not generated, and a leakage current transmitted from the second light emitting layer EL2 to the first light emitting layer EL1 is not generated. That is, in the present disclosure, the leakage current transmitted to the adjacent pixels through the light emitting layer is not generated, whereby a brightness of light output from each pixel is not affected by the adjacent pixels.

FIGS. 12A to 12D are exemplary views illustrating a method for manufacturing the light emitting display panel shown in FIG. 11. In the following description, the same or similar content as described with reference to FIGS. 1 to 11 is omitted or briefly described.

Figure 12A:
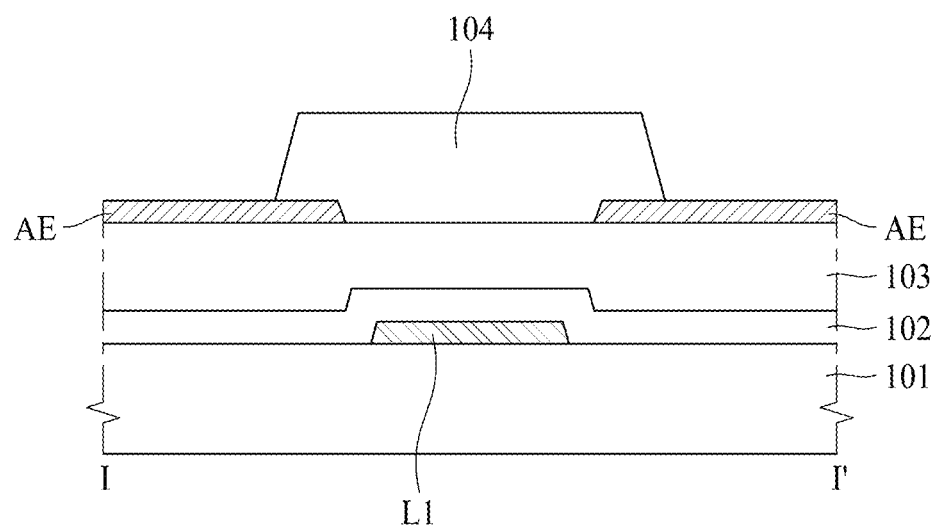
FIGS. 12A to 12D illustrate a method for manufacturing the light emitting display panel shown in FIG. 11.

First, as shown in FIG. 12A, the first signal line L1, that is, the data line DL1 is provided on the substrate 101, the first signal line L1 is covered by the first insulating film 102, the first insulating film 102 is covered by the second insulating film 103, the anode electrode AE is patterned on the second insulating film 103, and the ends of the anode electrode AE are covered by the bank 104.

The bank 104 is formed on the second insulating film 103 and is configured to be overlapped with the first signal line L1.

Figure 12B:
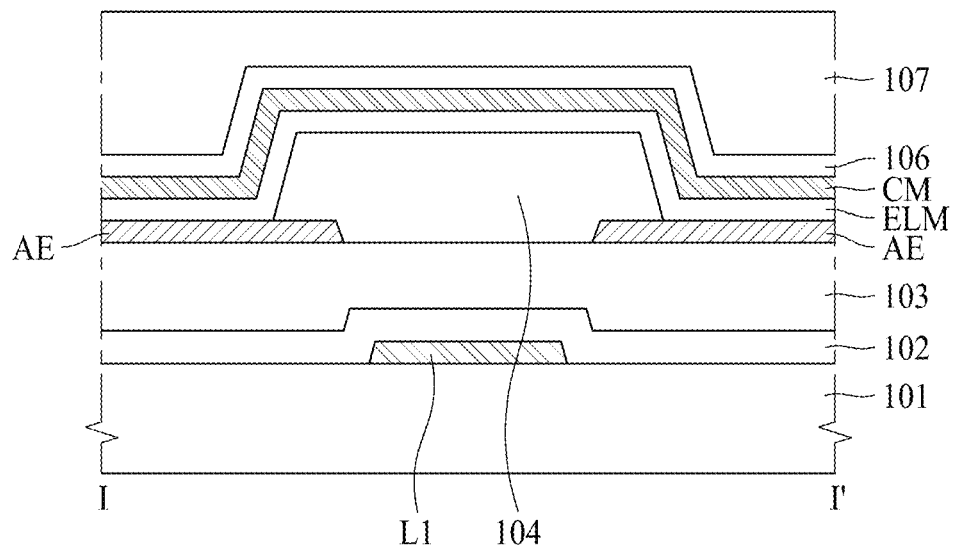

Then, as shown in FIG. 12B, a light emitting layer material ELM for forming the first light emitting layer EL1 and the second light emitting layer EL2 is provided on the entire surface of the substrate 101 so as to cover the anode electrodes AE and the bank 104.

The cathode metal CM forming the first cathode electrode CE1 and the second cathode electrode CE2 is formed on the entire upper surface of the light emitting layer material ELM.

The third insulating film 106 is formed on the entire upper surface of the cathode metal CM.

The encapsulation film 107 is formed on the entire upper surface of the third insulating film 106.

Figure 12C:
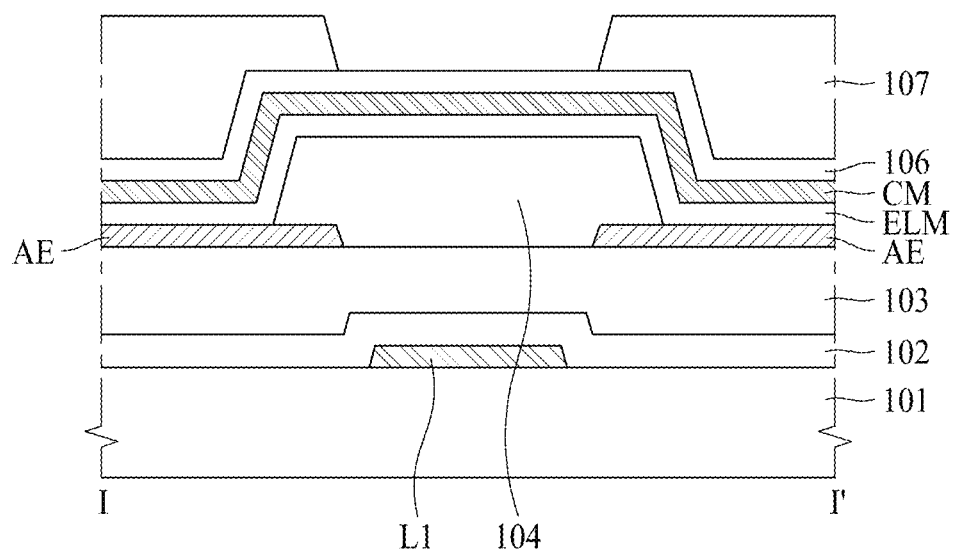

Then, as shown in FIG. 12C, the encapsulation film 107 corresponding to the upper surface of the bank 104 is etched to expose the third insulating film 106.

Figure 12D:
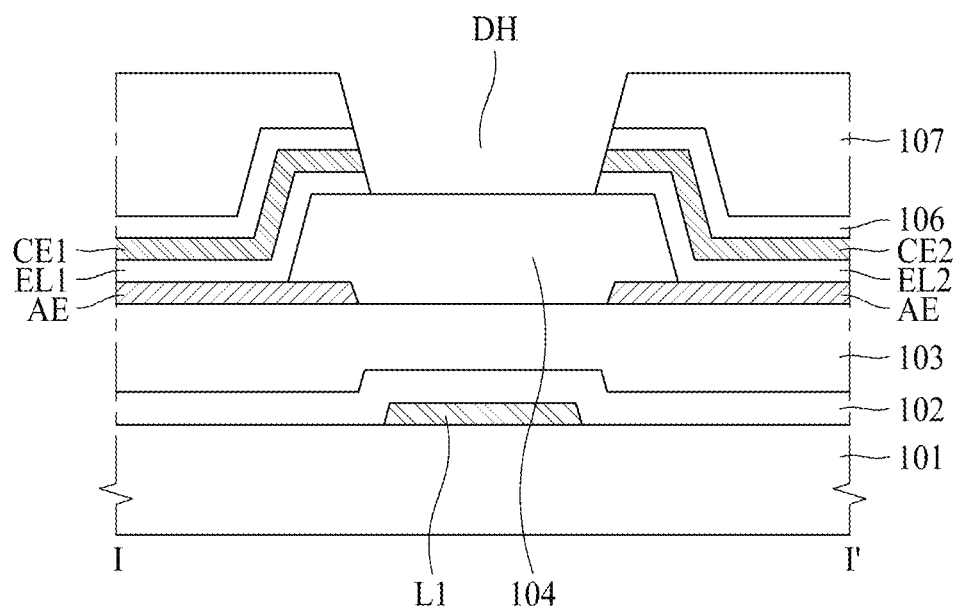

Next, as shown in FIG. 12D, according as the third insulating film 106, the cathode metal CM, and the light emitting layer material ELM are etched by a dry etching, the separation hole DH is formed, whereby the first light emitting layer EL1, the second light emitting layer EL2, the first cathode electrode CE1, and the second cathode electrode CE2 are formed. Also, the third insulating film 106 and the encapsulation film 107 are also separated through the separation hole DH.

Finally, as the fourth insulating film 108 covers the upper surface of the encapsulation film 107 and the separation hole DH, the light emitting display panel having a cross section as shown in FIG. 11 may be manufactured.

According to the present disclosure, the area overlapped with the data lines is patterned in the cathode electrode, whereby the parasitic capacitance between the cathode electrode and the data lines may be reduced.

Accordingly, the degradation of image quality caused by the RC load in the cathode electrode and the data lines may be reduced in the present disclosure.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the technical idea or scope of the disclosures. Thus, it is intended that the present disclosure covers the modifications and variations of this disclosure provided they come within the scope of the appended claims and their equivalents.

What is claimed is:
1. A light emitting display panel comprises:
a substrate;
a first signal line disposed along a first direction of the substrate and provided on the substrate;
a first insulating film disposed on the substrate and configured to cover the first signal line;
a second insulating film configured to cover the first insulating film;
an anode electrode disposed on the second insulating film, electrically connected with a driving transistor disposed on the first insulating film, and patterned by each pixel;
a bank disposed on the second insulating film while being overlapped with the first signal line and configured to cover ends of the anode electrode;
a first light emitting layer disposed on a anode electrode disposed at a first side of the bank with respect to the bank;
a second light emitting layer disposed on a anode electrode disposed at a second side of the bank with respect to the bank;
a first cathode electrode disposed on the first light emitting layer; and
a second cathode electrode disposed on the second light emitting layer,
wherein the first cathode electrode and the second cathode electrode are separated from each other on the upper surface of the bank.
2. The light emitting display panel according to claim 1, wherein the first signal line is a data line.

3. The light emitting display panel according to claim 1, further comprising a partition overlapped with the first signal line and disposed on the upper surface of the bank,
wherein the first light emitting layer and the first cathode electrode are separated from the second light emitting layer and the second cathode electrode by the use of partition on the upper surface of the bank.

4. The light emitting display panel according to claim 3, wherein a width of an upper surface of the partition is larger than a width of a lower surface of the partition.

5. The light emitting display panel according to claim 3, further comprising a third insulating film configured to cover the first cathode electrode, a first lateral surface of the partition disposed at the first side, a second lateral surface of the partition disposed at the second side, the upper surface of the bank exposed between the first cathode electrode and the partition, the upper surface of the bank exposed between the second cathode electrode and the partition, and the second cathode electrode.

6. The light emitting display panel according to claim 5, further comprising an encapsulation film configured to cover the third insulating film so as to expose a portion of the third insulating film disposed on the first lateral surface of the partition and a portion of the third insulating film disposed on the second lateral surface of the partition.

7. The light emitting display panel according to claim 6, further comprising a fourth insulating film configured to cover the third insulating film, the encapsulation film and the partition.

8. The light emitting display panel according to claim 1, wherein the first light emitting layer and the first cathode electrode are separated from the second light emitting layer and the second cathode electrode on the upper surface of the bank.

9. The light emitting display panel according to claim 1, further comprising a third insulating film configured to cover the first cathode electrode and the second cathode electrode,
wherein the third insulating film is separated from each other on the upper surface of the bank.

10. The light emitting display panel according to claim 9, further comprising an encapsulation film configured to cover the third insulating film, wherein the encapsulation film is separated from each other on the upper surface of the bank.

11. The light emitting display panel according to claim 10, further comprising a fourth insulating film configured to cover an exposed portion of the upper surface of the bank, which is exposed by the encapsulation film, and the encapsulation film.

12. A light emitting display apparatus comprising:
a light emitting display panel according to claim 1;
a data driver configured to supply data voltages to data lines disposed in the light emitting display panel;
a gate driver configured to supply gate voltages to gate lines disposed in the light emitting display panel; and
a controller configured to control the data driver and the gate driver.

* * * * *